(12) United States Patent
McCarten

(10) Patent No.: US 9,848,142 B2
(45) Date of Patent: Dec. 19, 2017

(54) METHODS FOR CLOCKING AN IMAGE SENSOR

(71) Applicant: SEMICONDUCTOR COMPONENTS INDUSTRIES, LLC, Phoenix, AZ (US)

(72) Inventor: John Paul McCarten, Penfield, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 41 days.

(21) Appl. No.: 14/796,581

(22) Filed: Jul. 10, 2015

(65) Prior Publication Data

US 2017/0013215 A1    Jan. 12, 2017

(51) Int. Cl.
| | | |
|---|---|---|
| H04N 5/361 | (2011.01) | |
| H04N 5/3728 | (2011.01) | |
| H01L 27/148 | (2006.01) | |
| H01L 27/146 | (2006.01) | |
| H04N 5/376 | (2011.01) | |

(52) U.S. Cl.
CPC ....... *H04N 5/361* (2013.01); *H01L 27/14616* (2013.01); *H01L 27/14818* (2013.01); *H01L 27/14831* (2013.01); *H04N 5/3728* (2013.01); *H04N 5/3765* (2013.01)

(58) Field of Classification Search
CPC .... H04N 5/361; H04N 5/3592; H04N 5/3722; H04N 5/3728; H04N 5/378; H04N 5/3765; H04N 5/37213; H01L 27/14818; H01L 27/14887; H01L 27/14837; H01L 27/14843; H01L 27/14616; H01L 27/14831

USPC .................................................. 348/320–323
See application file for complete search history.

(56) References Cited

U.S. PATENT DOCUMENTS

| | | | |
|---|---|---|---|
| 3,853,634 A | | 12/1974 | Amelio et al. |
| 4,977,584 A | * | 12/1990 | Kohno .............. H01L 27/14831 257/223 |
| 5,250,825 A | | 10/1993 | Negishi et al. |
| 5,264,374 A | | 11/1993 | Watanabe et al. |

(Continued)

OTHER PUBLICATIONS

Schroder et al., "Negative bias temperature instability: Road to cross in deep submicron silicon semiconductor manufacturing," Jul. 1, 2003, pp. 1-18, vol. 94, No. 1.

(Continued)

*Primary Examiner* — Albert Cutler
(74) *Attorney, Agent, or Firm* — Treyz Law Group, P.C.; Vineet Dixit

(57) ABSTRACT

A method of clocking an image sensor which eliminates well bounce effects caused by global current flow in large image sensors during frame readout and line transfer is described. During charge transfer operations in which voltages are applied to VCCD gate contacts that are adjacent to the photodiodes, a compensating voltage may be applied to the lightshield that is associated with, and at least partially formed over the photodiode. Depending on polarity, the compensating lightshield pulse allows holes to locally flow from under the VCCD gates to the photodiode P+ pinning region or vice-versa, and in such a manner to eliminate the global flow of hole current. Lightshields may also be biased during electronic shuttering operations.

22 Claims, 12 Drawing Sheets

(56) References Cited

U.S. PATENT DOCUMENTS

| | | | |
|---|---|---|---|
| 5,298,448 A | 3/1994 | Stevens et al. | |
| 5,460,997 A | 10/1995 | Hawkins et al. | |
| 5,929,470 A | 7/1999 | Harada et al. | |
| 6,586,784 B1 | 7/2003 | Parks | |
| 6,995,795 B1* | 2/2006 | Losee | H01L 27/14806 257/E27.151 |
| 7,016,089 B2 | 3/2006 | Yoneda et al. | |
| 7,230,288 B2 | 6/2007 | Yamane et al. | |
| 8,017,984 B2* | 9/2011 | Kitano | H01L 27/14601 257/294 |
| 2005/0001915 A1 | 1/2005 | Mabuchi et al. | |
| 2007/0252183 A1* | 11/2007 | Ishida | H01L 27/14812 257/292 |
| 2008/0122933 A1* | 5/2008 | Murayama | H01L 27/14837 348/164 |

OTHER PUBLICATIONS

Burke et al., "Dynamic Suppression of the Interface-State Dark Current in Buried-Channel CCD's," Feb. 1991, pp. 285-290, IEEE vol. 38, No. 2.

\* cited by examiner

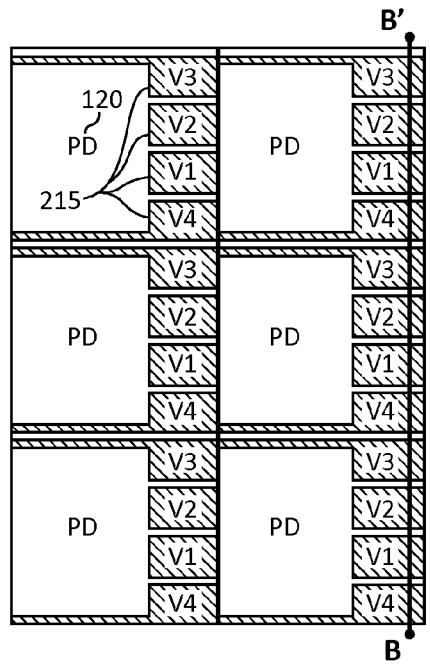
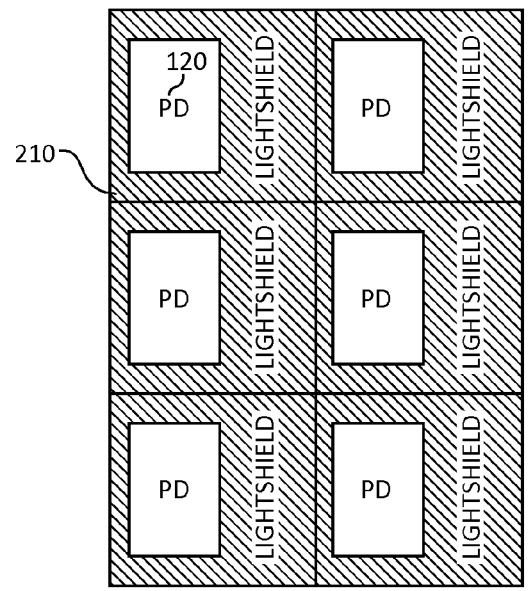
FIG. 3A          FIG. 3B
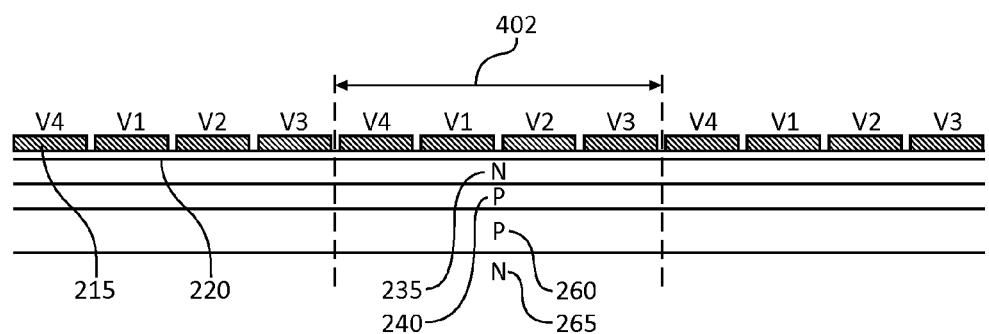
FIG. 4

METHODS FOR CLOCKING AN IMAGE SENSOR

BACKGROUND

This relates generally to imaging systems, and more particularly to clocking methods for interline charge coupled device (CCD) image sensors that reduce lag, improve smear, reliability, and dark current performance, enable the use of low clocking voltages, and enable faster readout of image sensors.

Electronic devices such as cellular telephones, cameras, and computers often include imaging systems that include digital image sensors for capturing images. Image sensors may be formed having a two-dimensional array of image pixels that contain photodiodes that convert incident photons (light) into electrical signals. Electronic devices often include displays for displaying captured image data.

Conventional interline CCD imagers are provided with multiple photodiodes that are formed below a pinning layer. In a conventional imager, the photodiodes are typically n-type doped regions in a semiconductor substrate. The pinning layer formed over the photodiodes is usually a p-type doped layer. The pinning layer formed over the photodiodes is conventionally coupled to ground and serves as a ground for the photodiode. The potential of the photodiode remains constant as long as the voltage provided at the pinning layer is constant, and there is no net global current flow throughout the device.

Light incident on the imager results in the accumulation of photo-generated electrons in the n-type photodiode region. Some of these photo-generated electrons are read out into a vertical CCD (VCCD) by applying a read-out voltage (sometimes referred to as the "third-level voltage") to a transfer gate that is formed over the VCCD and a region between the photodiode and the VCCD.

The "third-level voltage" conventionally used in the readout of photo-generated charges from photodiodes to the VCCD is usually a large voltage such as 12V. The large voltage applied to the transfer gate that is formed over the VCCD causes holes, which are the majority charge carrier in the p-type pinning layer formed over the photodiodes, to be repelled. The global current generated by the movement of holes in the pinning layer formed over the photodiodes results in a voltage drop (sometimes referred to as an "I-R drop") of the voltage in the pinning layer. The inconstancy of the voltage at the pinning layer is referred to as "well bounce," and can be detrimental to the performance of an imager.

Well bounce increases the readout time of a photodiode because the global currents must be allowed time to settle, thereby limiting the speed and efficiency of an imager. Because the potential of the photodiode is no longer "pinned" by a constant ground voltage at the pinning layer formed over the photodiode, the step in voltage potential between photodiode and the VCCD is reduced. In instances where the pinning layer voltage varies substantially, the decrease in the voltage potential step between the photodiode and the VCCD makes it impossible to completely transfer all of the photo-generated charge out of the photodiode into the VCCD.

The inconstancy of the pinning layer voltage level spatially varies across a conventional imager. As an example, a first pinning region associated with a first photodiode at an edge of the imager may be close to a ground supply voltage that provides the ground voltage to the first pinning region. Therefore, when the photodiode is read out, the current generated by the movement of holes in the pinning layer in which the first pinning region is located does not result in a large voltage drop, because the distance to the ground supply is small. However, a second pinning region associated with a second photodiode at the center of the imager may be separated from the ground supply that provides the ground voltage to the second pinning region by a greater distance. As a result, when the photodiode is read out, the current generated by the movement of holes in the pinning layer in which the second pinning region is located will result in a large voltage drop (or, a large "well bounce").

Because well bounce varies as a function of the location of a photodiode on the imager, the inconsistencies in the photodiode readout may result in visible image artifacts, or a fixed pattern artifact in the image data.

A number of techniques have been developed in an attempt to alleviate the well bounce problem. One technique involves the addition of well contacts within the pixel array, as described in, for example, U.S. Pat. No. 7,016,089, entitled "Amplification-Type Solid State Imaging Device with Reduced Shading." Unfortunately, this addition of well contacts within the pixel array takes up limited die area that could otherwise be used for sensing light, and thus adversely impacts the performance of the image sensor. Also, ground contacts to silicon are known to generate bright points because the contact is not positively biased and thus does not drain off charge generated by defects created at the contact/semiconductor interface. Another technique involves reducing the clock speed for certain signals associated with sampling and readout of the pixels. See, for example, U.S. Patent Application Publication No. 2005/0001915, entitled "Solid-State Imaging Device and Drive Control Method for the Same." However, slower clocking means it will take longer to read out the pixel data associated with a given image.

Once the photo-generated charge is transferred to the VCCD, dark current signal adds to the photo-generated charge packet, corrupting the signal. Dark current signal is influenced by temperature, metallic impurity concentration, density of unpassivated silicon bonds (surface states), read-out-time, line-time, and whether the VCCD timing is operated in "depletion mode" or "accumulation mode."

For "depletion mode" timing, one or more VCCD gates are biased at the mid-level voltage and one or more VCCD gates are biased at the low-level voltage during line readout. For "accumulation mode" clocking, all VCCD gates are biased at the low-level voltage during line readout. Dark current generation is much lower for gates held at the more negative low-level voltage because the low-level voltage is typically biased just past the threshold for accumulating holes at the silicon-dielectric interface. Holes accumulated at the surfaces "quench" the dark current generated by unpassivated silicon bonds.

Dark current for "depletion mode" timing is typically 2 or more orders of magnitude greater than for "accumulation mode" timing, thus "accumulation mode" timing is the preferred timing for reduced dark current performance. However just like "third-level" readout, well bounce complicates reading out the VCCD in "accumulation mode". Well bounce is typically not an issue for "depletion mode" timing because clock edges are compensated. Here compensated means that for every gate that transitions from a low-level voltage to a mid-level voltage there is an adjacent gate that transitions from a mid-level voltage to a low-level voltage. Therefore if the gate capacitances are properly matched there is only a local flow of holes between adjacent gates, and no global flow of holes resulting in well bounce.

It is possible to reduce or eliminate well bounce for "accumulation mode" timing by applying a voltage more negative than the low-level voltage. The compensating voltage applied to another gate adjacent to the given gate is usually a negative voltage with a large magnitude, such as −11 V. The problem with the −11V compensation pulse is reliability.

The low-level voltage is almost always specified such that the regions of the VCCD that underlie the gate contacts on which the low-level voltage is applied are biased just past the threshold for accumulating holes at the silicon-dielectric interface. This state is a compromised state that balances dark current performance with reliability. Reliability issues occur when clocking gates back and forth between depletion (such as when the mid-level voltage is applied) and accumulation (such as when the low-level or compensating voltage is applied), causing the flow of holes along the surface. Occasionally a hole has enough energy to disrupt a hydrogen-silicon (H—Si) bond at a passivate interface state, dislodging the hydrogen from the surface.

If the gate is negative, such as when the low-level voltage is applied to the gate, the hydrogen drifts away from the Si/dielectric interface since atomic H is positively charged. These events increase the number of unpassivated interface states, and therefore increase the VCCD dark current. This mechanism is identical to the better-known Negative Bias Temperature Instability (NBTI) for CMOS parts, as reviewed by D. K. Schroder and J. A. Babcock in "Negative bias temperature instability: Road to cross in deep submicron silicon semiconductor manufacturing". The more negative the voltage the more severe the reliability problem. Thus for reliability purpose, the low-level voltage is often specified just low enough to accumulate the surface with holes. This voltage is sufficient to significantly reduce VCCD dark current, but not too low as to increase the accumulated hole density, and hence the probability of a NBTI event.

In conventional imagers, the −11V compensation voltage pulse accumulates a high density of holes. The accumulation and flow of these excess holes dramatically increases the likelihood of NBTI degradation. Since clocking the imager by providing a compensating voltage pulse on a gate formed on the VCCD (sometimes referred to as "accumulation mode clocking") provides lower dark current, and clocking the imager without providing the compensating voltage pulse on a VCCD gate (sometimes referred to as "depletion mode clocking") provides larger VCCD capacity, many camera designers like to have the option of either timing depending on light condition. However, accumulation mode clocking is incompatible with depletion mode clocking because of the accelerated NBTI that results from conventional accumulation mode clocking. Also, for cameras that only use accumulation mode clocking, the NBTI degradation can be so extreme as to increase the VCCD dark current to unacceptable levels.

Accordingly, what is needed is a technique that significantly reduces or eliminates well bounce for "third-level" timing, "accumulation mode" timing, and other timings with uncompensated clock edges and while avoiding the disadvantages associated with the above-noted conventional techniques.

BRIEF DESCRIPTION OF THE DRAWINGS

FIG. 3A is a top view of a 4-phase interline CCD showing the photodiodes and VCCD gate electrodes.
FIG. 3B is a top view of an interline CCD showing the photodiode and lightshield.
FIG. 4 is a cross-sectional side view through line B-B' in FIG. 3A of a 4-phase interline CCD illustrated without the lightshield.

DETAILED DESCRIPTION

Figure 1:
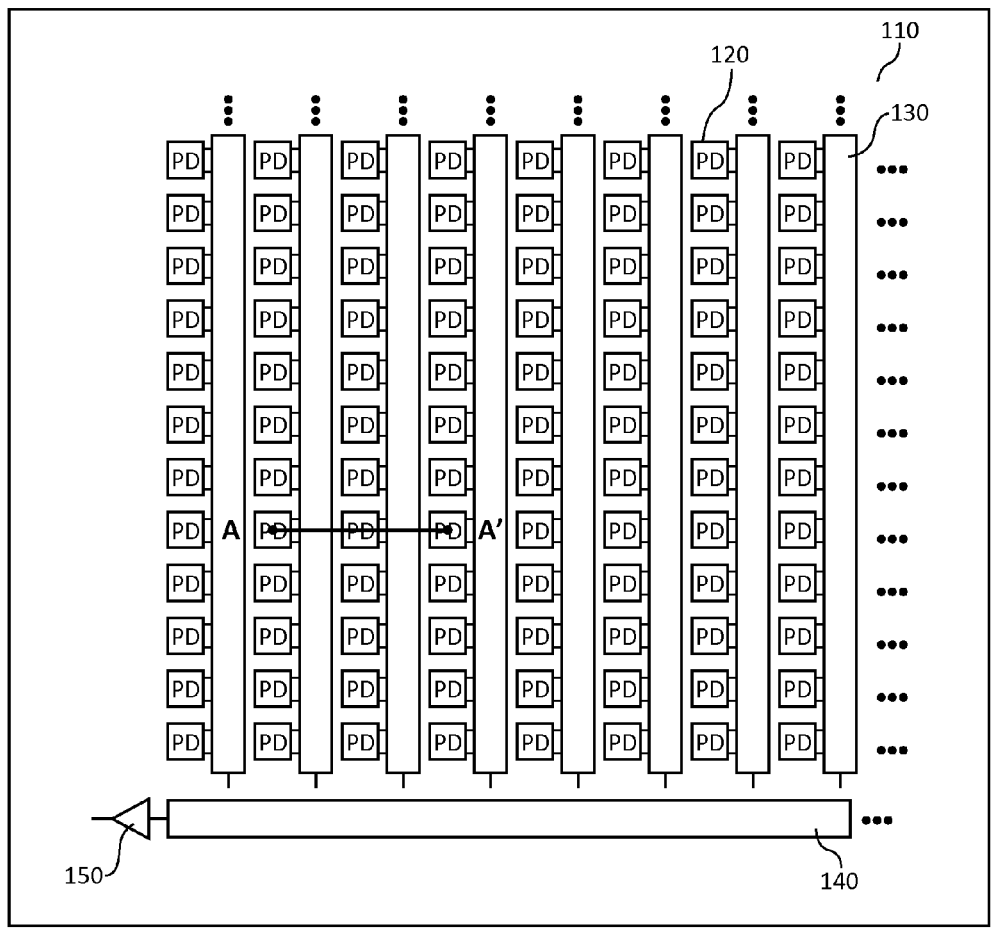
FIG. 1 is a block diagram of an interline image sensor.

FIG. 1 is a diagram of the basic configuration of an interline charge coupled device (CCD) image sensor 110. Image sensor 110 may integrated into a vehicle safety system (e.g., a rear-view camera or other vehicle safety system), a surveillance system, an electronic device such as a camera, a cellular telephone, a video camera, or any other desired electronic device that captures digital image data. The light gathering units may include an array of photodiodes 120 arranged in rows and columns. Photodiodes 120 may each be associated with an image pixel, and may be therefore be interchangeably referred to as "pixel photodiodes." Light filtering elements such as color filters, plasmonic light filters, resonance enhanced color filters, or any other filter elements may be formed over each of photodiodes 120. Lens elements such as microlenses may also be formed over photodiodes 120.

Each column of photodiodes 120 in image sensor 110 may be associated with a respective vertical CCD (VCCD) 130. One or more horizontal CCDs (HCCDs) 140 may also be provided in image sensor 110, and may be coupled to an output amplifier 150 that provides image pixel signals to additional image readout and processing circuitry (not shown). In a progressive scan readout mode, every photodiode 120 may simultaneously transfer some or all of the photo-generated charge collected in the photodiode during an image capture mode, to their respective VCCDs 130. As an example, some or all of the photo-generated charge from photodiodes 120 in a first column of image sensor 110 may be transferred to a first VCCD 130, while some or all of the photo-generated charge from photodiodes 120 in a second column of image sensor 110 may be transferred to a second VCCD 130 at the same time.

Charge in the VCCDs 130 may be read out by transferring all columns in parallel, one row at a time, into the HCCD 140. As an example, charge associated with the last row of all the columns in the image sensor may be transferred from VCCDs 130 associated with every column of photodiodes 120 in the image sensor 110 to HCCD 140. While charge associated with the last row of image sensor 110 is transferred from VCCDs 130 to HCCD 140, charge associated with the second-to-last row of image sensor 110 may be transferred to the regions of VCCDs 130 in from which the charge associated with the last row of image sensor 110 was stored. In other words, while charge associated with an n-th row is transferred from VCCDs 130 to HCCD 140, charge associated with a (n−1)-th row may be transferred within the VCCDs 130 to occupy the region of VCCDs 130 previously occupied by charge associated with the n-th row and may then be ready to be read-out or transferred to HCCD 140.

Once HCCD 140 receives charge associated with a given row from VCCDs 130, the HCCD 140 may then serially transfer charge to an output amplifier 150. To increase frame rate, interline CCDs may have more than one output amplifier (not shown).

To transfer the charge packets, early designs used only polysilicon gates in the VCCD 130 and HCCD 140 regions. Within a pixel, the VCCD 130 and HCCD 140 regions include of one or more polysilicon gates. Clocking the voltages on these gates between a positive and negative potential provides a means for transferring the charge in a bucket-brigade fashion. There are two problems with designing VCCDs 130 and HCCDs 140 with only polysilicon gates. The first problem is that polysilicon is moderately transparent to light; therefore, unwanted column artifacts known as smear may be generated in VCCD columns 130 that pass through bright regions. The second problem is that the resistivity of the polysilicon gates is on the order of 50 ohms/box; therefore, the larger the image sensor 110, the slower the polysilicon gates need to be clocked because of RC time delays to the center of the pixel array.

Figure 2:
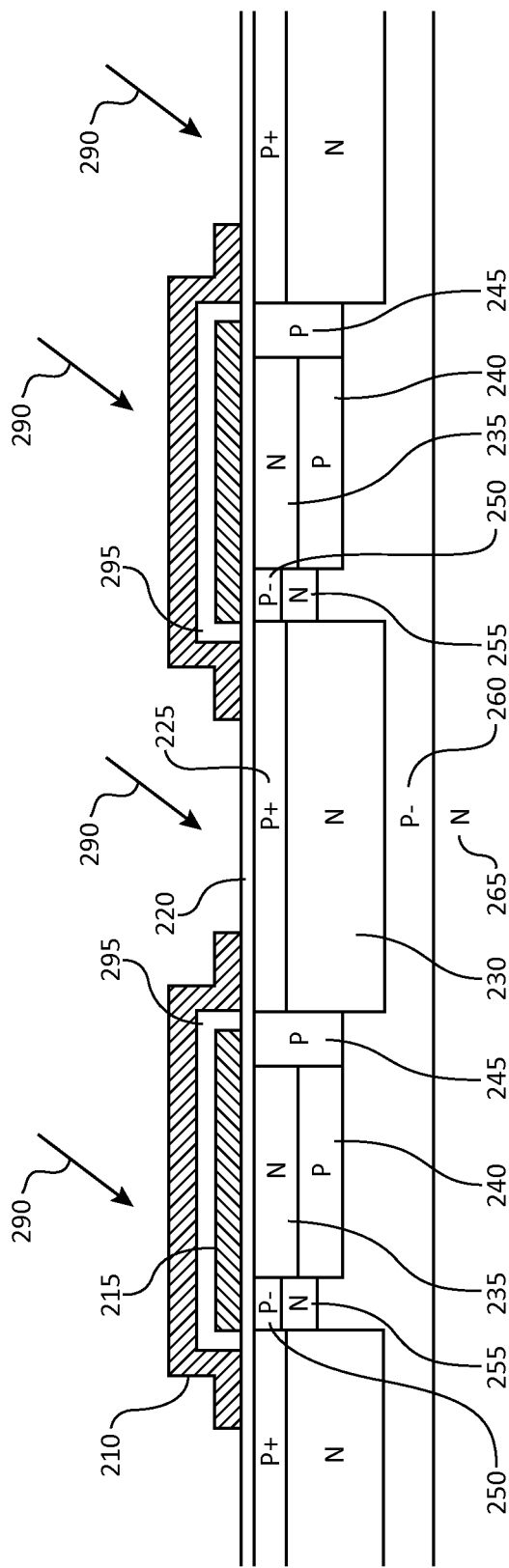
FIG. 2 is a cross-sectional side view through line A-A' in FIG. 1 of an interline CCD with a lightshield.

The addition of a metal lightshield over the VCCDs 130 improves smear performance, and this improved performance is satisfactory for most lighting conditions. FIG. 2 is a cross-sectional side view through line A-A' in FIG. 1 for an interline CCD such as image sensor 110. The lightshield 210 may block incident light 290 from striking the gate electrode 215 and reaching the channel implant that defines the VCCD 235. Lightshield 210 may be formed over n-type implant 235 (sometimes referred to as "the VCCD channel 235") and may be formed at least partially over photodiode 230. Specifically, as illustrated in FIG. 2, lightshield 210 may be formed above at least a portion of pinning implant 225 that is formed above photodiode 230. Lightshield 210 may be formed over gate 215, and may be separated from gate 215 by a dielectric 295. Gate 215 may be formed at least partially over p-doped region 245 and p− implant 250.

The channel implant that defines the VCCD 235 may include p-doped regions 240 and 245. Gate dielectric 220 may electrically isolate the gate 215 from the semiconductor in which doped regions 225-260 are formed. Semiconductor substrate 265 and doped regions 225-260 may be collectively referred to as "the semiconductor." P+ pinning implant 225 may have a high enough concentration of p-type dopants to accumulate holes at the interface of dielectric 220 and the semiconductor. This hole-accumulation layer reduces dark current and establishes the ground connection to the periphery of the pixel array of image sensor 110. The P+ pinning implant 225 may be shared for pixels in a given column, and may be formed over multiple photodiodes 120 in a given column of image sensor 110.

Photo-generated electrons may be collected in the photodiode 230. The deep P-region 260 may establish a vertical overflow drain between the photodiode 230 and the N substrate 265. In bright light situations, the excess charge carriers from the photodiode 230 may flow into the substrate instead of blooming into the VCCD channel 235. The P-type implants 240 and 245 may provide isolation between the VCCD channel 235 and the photodiode 230. The P− implant 250 and N implant 255 may set the transfer gate potential between the photodiode 230 and VCCD channel 235.

Photogenerated electrons that are collected in the photodiode 230 are transferred to the VCCD channel 235 by applying a positive voltage on the gate electrode 215. For an interline CCD this voltage is typically 12 V.

FIG. 3A illustrates a top view or a plan view of a three row by two column portion of an interline CCD image sensor 110. The present invention may be applied to an interline CCD with any number of rows and columns. FIG. 3A illustrates a photodiode 120 and gates or gate contacts 215 that are formed adjacent to the photodiode 120. Each photodiode 120 in image sensor 110 may be associated with at least one gate 215 that is formed adjacent to photodiode 120. Gate 215 may be referred to as a "phase" or a "vertical phase," and image sensor 110 may be referred to as a "multi-phase interline CCD sensor" if more than one gate 215 is formed adjacent to each photodiode 120. FIG. 3A illustrates a four-phase interline CCD sensor because four gates 215 are associated with, and formed adjacent to each photodiode 120. However, the present invention is not restricted to four-phase sensors, and may be applied to sensors with any number of phases, or gates associated and formed adjacent to each photodiode in the sensor.

FIG. 3B illustrates a top view or a plan view of a three row by two column portion of an interline CCD image sensor 110, specifically illustrating lightshields 210. As described in connection with FIG. 2 above, lightshields 210 may be formed over at least a portion of photodiodes 120. Lightshields 210 may also be formed over gates 215, which are obscured from view in the top view of FIG. 3B.

FIG. 4 illustrates a cross-sectional side view through line B-B' of FIG. 3A, but does not illustrate the lightshield 210 for the sake of clarity. The semiconductor region underneath a set of gates 215 under the unit pixel 402 may correspond to a region of the VCCD 130 that is associated with and adjacent to a particular photodiode 120 in image sensor 110. VCCD 130 may have many such regions that are associated with and adjacent to particular photodiodes 120, and into which photo-generated charge from photodiodes 120 are transferred. Transfer of charge from a particular photodiode 120 to an adjacent region of VCCD 130 may be accomplished by applying voltages to the gates V1-V4 formed above the region of VCCD 130 that is adjacent to the particular photodiode 120. In an interline CCD image sensor 110, respective photo-generated charges from all of the photodiodes 120 may be transferred to respective regions of the VCCD 130 at the same time. Transferring charges from all of the photodiodes 120 to VCCDs 130 may be referred to as a "frame transfer." Application of voltages to gates V1-V4 formed above VCCD 130 may be referred to as "clocking operations" of the image sensor 110, and more specifically "frame transfer clocking operations."

Figure 5:
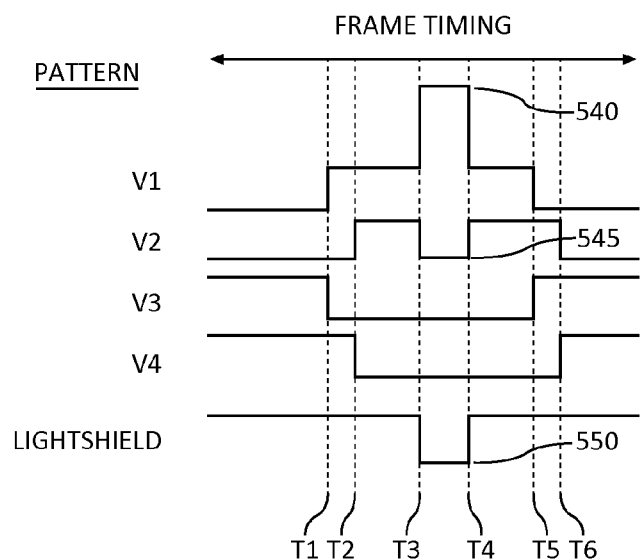
FIG. 5 is a first frame timing diagram that shows compensating voltages applied to a lightshield in accordance with an embodiment.

FIG. 5 illustrates a timing diagram for frame transfer clocking operations, which may be referred to as a "frame timing diagram." The frame timing diagram illustrated in FIG. 5 relates to the frame timing diagram for a 4-phase device. However, the present invention is not limited to a 4-phase device and can be applied to devices with any number of phases, as will be described below. The actual "frame transfer" in FIG. 5 may refer to the interval between clock edges t3 and t4. Edges t1-t6 of FIG. 5 may be referred to as "clock edges," but are not limited to be edges that correspond to the rising or falling edges of any clock and may be asynchronous. Consequently, the intervals between any pair of edges selected from edges t1-t6 of FIG. 5 may or may not be a multiple of the period of any clock on image sensor 110.

For the illustrative frame timing diagram of FIG. 5, charge storage in the VCCD register is under vertical phases V3 and V4 (illustrated in FIG. 4) at the start of the timing diagram (i.e., before edge t1 of FIG. 5), where the gate voltages for V3 and V4 may be 0 V, and the V1 and V2 gates are blocking with gate voltages of −7 V. Before the frame transfer at clock edge t3 of FIG. 5, the VCCD storage region is typically shifted two phases at clock edges t1 and t2 of FIG. 5. During the frame transfer between clock edges t3 and t4 of FIG. 5, the transfer gate V1 is taken high to a third-level transfer voltage level 540, and V2 is taken low to low voltage level 545 to compensate the third level transfer voltage applied to gate V1. However, the third level transfer voltage 540 applied to V1 at clock edge t3 is typically 12 V and the low level voltage 545 is typically −7 V, so the negative going voltage 545 on gate V2 at clock edge t3 only partially compensates the positive going third level voltage 540 applied to V1 at clock edge t3 of FIG. 5. A fully compensated clock edge satisfies equation 1, listed below:

$$\sum_n C_n \Delta V_n = \sum_n \Delta Q_n = 0 \quad (1)$$

In the above equation 1, $C_n$ is the per pixel capacitance for gate n, $\Delta V_n$ is the change in voltage applied to gate n, and thus $\Delta Q_n$ is the change in charge under gate n. When the above sum is zero, there are only local currents between phases or gates (such as gates V1-V4 illustrated in FIG. 4) and no global current flow from the periphery of the pixel array. It is the global current flow that is responsible for well bounce. Since the per pixel capacitance for most designs are nearly the same for all phases, the magnitude in voltage differences between the third level voltage 540 and the low level voltage 545 that are applied to gates V1 and V2 respectively during the frame transfer (i.e., between edges t3 and t4 of FIG. 5) leads to an uncompensated condition in the absence of any other bias voltages near the gates V1-V4 on the VCCD 130. While lowering the third level voltage 540 from 12 V to 7 V (i.e., the same magnitude as low level voltage 545) could remedy the uncompensated condition, lowering the third level voltage 540 reduces photodiode capacity or degrade lag performance.

Instead of lowering the third level voltage 540 to achieve a fully compensated condition according to equation 1 during the frame transfer between edges t3 and t4 of FIG. 5, both gate V2 and lightshield 210 (see FIGS. 2 and 3B) may be clocked negative at edge t3 to first low level voltage 545 and second low level voltage 550 respectively, to fully compensate the third level voltage 540 pulse at edge t3, and satisfy the condition of equation 1. The transition at edge t3 of FIG. 5 for gate V1 may be a transition from 0 V to 12 V, where 12V is the third level voltage 540. The transition at edge t3 of FIG. 5 for gate V2 may be a transition from 0 V to −7 V, where −7V is the first low level voltage 545. The transition at edge t3 of FIG. 5 for lightshield 210 may be a transition from 0V to −7V, where −7V is the second low level voltage 550. The lightshield capacitance to silicon may be less than the gate capacitance to silicon; therefore the magnitude of the second voltage level 550 applied to lightshield 210 at edge t3 of FIG. 5 may be adjusted on a design-by-design basis for optimal performance or to achieve a compensated condition as defined in equation 1.

The negative going lightshield pulse (such as the transition of the voltage applied to lightshield 210 at edge t3 of FIG. 5 from a given voltage to a lower voltage), differs from a positive going lightshield pulse (such as a transition from a given voltage to a higher voltage) which is sometimes used in conventional image sensors to assist the readout of the photodiode to the VCCD by using the lightshield as a parasitic transfer gate.

Figure 7:
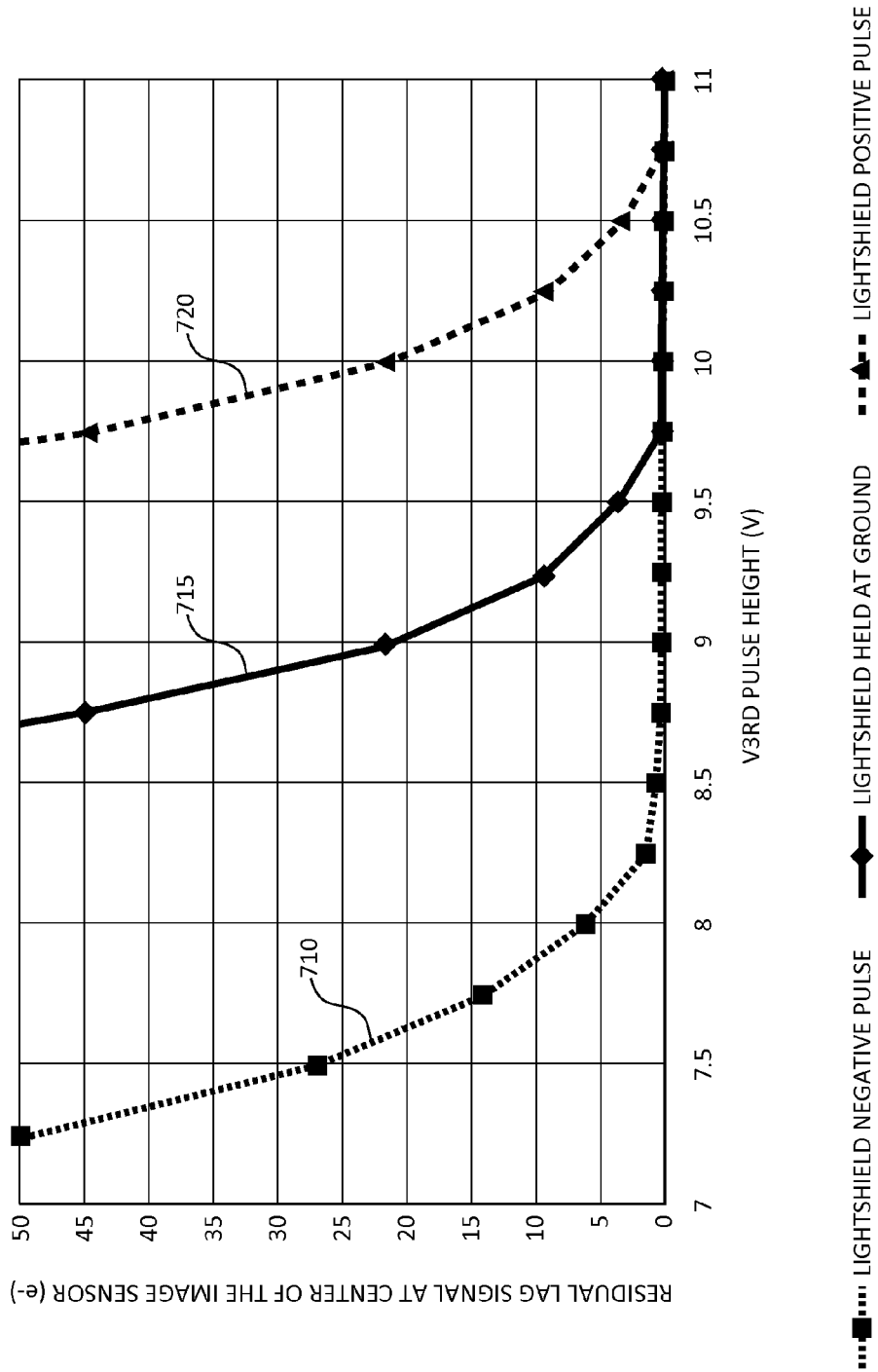
FIG. 7 is a graph illustrating residual lag signal at the center of a large interline CCD image sensor versus readout pulse height for different lightshield pulses during frame readout.

As illustrated in FIG. 7, which is a graph of residual lag signal at the center of a large image sensor versus the pulse height for different lightshield pulses during frame readout, a positive going lightshield pulse is detrimental to the performance of large image sensors. The residual lag signal units is electrons (e−). FIG. 7 illustrates the residual lag signal at the center of an interline CCD image sensor device for a given third level voltage level, such as the level of third level voltage 540 in FIG. 5. Compared to the case 715 where the lightshield is biased to ground, in the case 720 where a positive going lightshield pulse is applied, lag performance is degraded, indicating that well bounce effects dominate parasitic transfer gate effects for large devices. The degradation in lag performance in case 720 compared to case 715 is evidenced by the illustration in FIG. 7 that for the same third level voltage pulse value, the residual lag signal in case 720 is greater than the residual lag signal in case 715. In other words, a higher residual lag signal at the center of the imager is associated with degraded lag performance.

This effect of increase residual lag signal when a positive going lightshield will be even greater for very large devices that are stitched. In the case 710 that describes a negative going lightshield pulse such as the negative going voltage pulse that is applied to lightshield 210 at edge t3 of FIG. 5, an improvement in performance is seen. The improvement in lag performance is evidenced by the indication in FIG. 7 that for any given third level voltage pulse value, the residual lag in case 710 is lower than the residual lag signal in either case 715 or case 720. Similarly, the third level voltage pulse value required to achieve a given residual lag signal level is lower in case 710 when a negative going voltage pulse is applied to the lightshield, compared to cases 715 or 720 where the light shield is held at a constant voltage level or provided with a positive going pulse, respectively.

Returning to FIG. 5, after the third level voltage pulse or frame transfer that occurs between edges t3 and t4, the charge storage is returned from V1 and V2 to gates V3 and V4 at edges t5 and t6.

Figure 6:
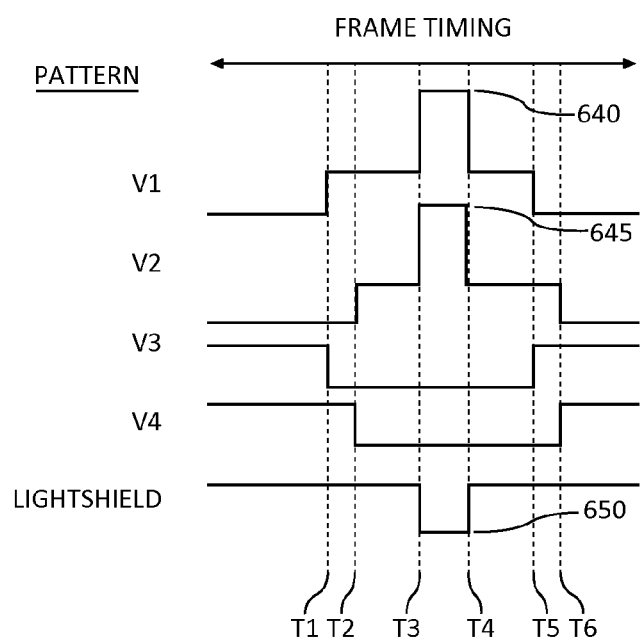
FIG. 6 is a second frame timing diagram that shows compensating voltages applied to a lightshield in accordance with an embodiment.

FIG. 6 illustrates another embodiment of a frame timing used to lessen narrow width effects. The edges t1-t6 of FIG. 6 may correspond to timings similar to edges t1-t6 in FIG. 5, respectively. During a frame transfer interval between edges t3 and t4 of FIG. 6, V1 and V2 may be clocked together to voltage levels 640 and 645, respectively, and may thereby double the width of the transfer gate. However, in the absence of any other bias voltages near the gates V1-V4 on the VCCD 130, clocking V1 and V2 together in this manner results in a highly uncompensated situation, because there is no negative going voltage pulse applied to any of the gates V3 and V4, or any other contact near the gates V1-V4 during the third level transfer between edges t3 and t4 of FIG. 6. One way to reduce well bounce is to delay the rising and falling edges of V2 currently illustrated as occurring at edges t3 and t4 of FIG. 6 respectively by a few microseconds, so the rising and falling edges of V2 during the frame transfer occur slightly after the rising and falling edges of V1 during the frame transfer. However, this extra delay will degrade blooming performance in high light situations. Even with the delay applied to V2, this frame timing leads to unacceptable levels of well bounce in large devices.

Instead of, or in addition to delaying the V2 pulse at edge t3 of FIG. 6 to reduce well bounce, during the third level portion of the frame transfer between edges t3 and t4 of FIG. 6, the lightshield 210 may be clocked negative to a voltage level 650 to compensate the positive going V1 and V2 pulses to levels 640 and 645 during the interval between edges t3 and t4 of FIG. 6. The lightshield capacitance to silicon may be less than the gate capacitance to silicon; therefore the magnitude of voltage 650 applied to the lightshield during the interval between edges t3 and t4 of FIG. 6 may be adjusted on a design-by-design basis for optimal performance. Also, for some designs, if the lightshield pulse required to satisfy the condition of equation 1 is too large for reliability concerns, the pulse amplitude 650 applied to the lightshield 210 may have to be reduced from the level required to provide full compensation as defined in equation 1.

Figure 8A:
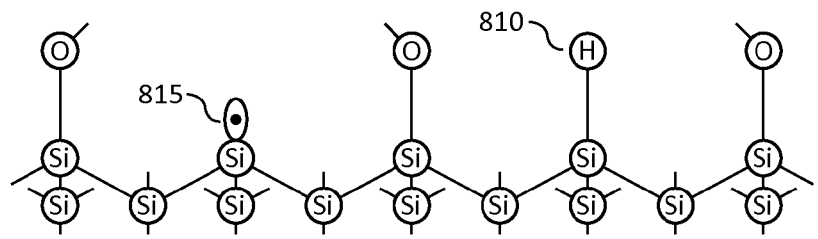
FIG. 8A illustrates an unterminated silicon (Si) bond and a hydrogen passivated Si bond at a Si/dielectric interface.

FIG. 8A illustrates an unpassivated, or unterminated silicon (Si) bond 815 and a hydrogen passivated Si bond 810. The bonds 810 and 815 may correspond to bonds on a silicon semiconductor substrate at an interface between the semiconductor and a dielectric such as dielectric 220 of FIG. 2. At an interface of silicon and dielectric, there may be as many as $3\times10^8$ unpassivated Si bonds such as 815 per square centimeter. Unpassivated Si bond 815 may be referred to as an "interface state."

Figure 8B:
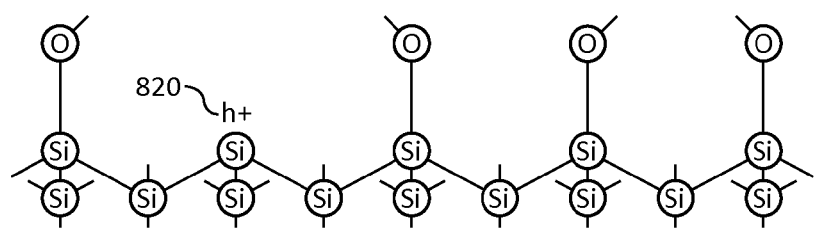
FIG. 8B illustrates a hole trapped at an unterminated Si bond.

For sufficiently negative gate voltages, holes may accumulate at the silicon surface (such as the boundary between dielectric 220 and VCCD channel 235 in FIG. 2), as shown in FIG. 8B. FIG. 8B illustrates an accumulated hole 820 binding to an interface state. This eliminates the unterminated bond and reduces the dark current generation rate due to the surface trap by 2 orders of magnitude or more. Quenching the dark current trap with bound hole 820 may effectively passivate the unterminated Si bond 815 of FIG. 8A. When the gate voltage is negative, the gate and the region of the VCCD below the gate may be referred to as in "accumulation," as it accumulates holes under those conditions.

Figure 8C:
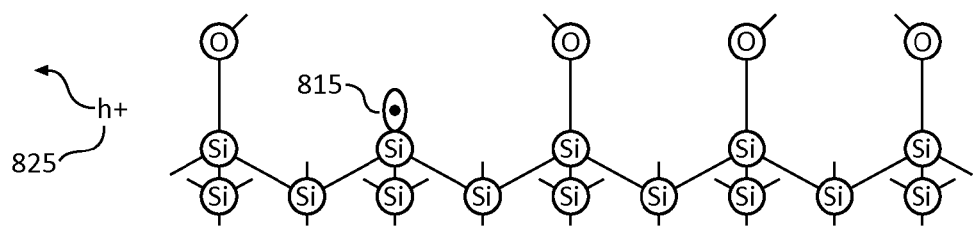
FIG. 8C illustrates a hole emitted from an unterminated Si bond.
Figure 9:
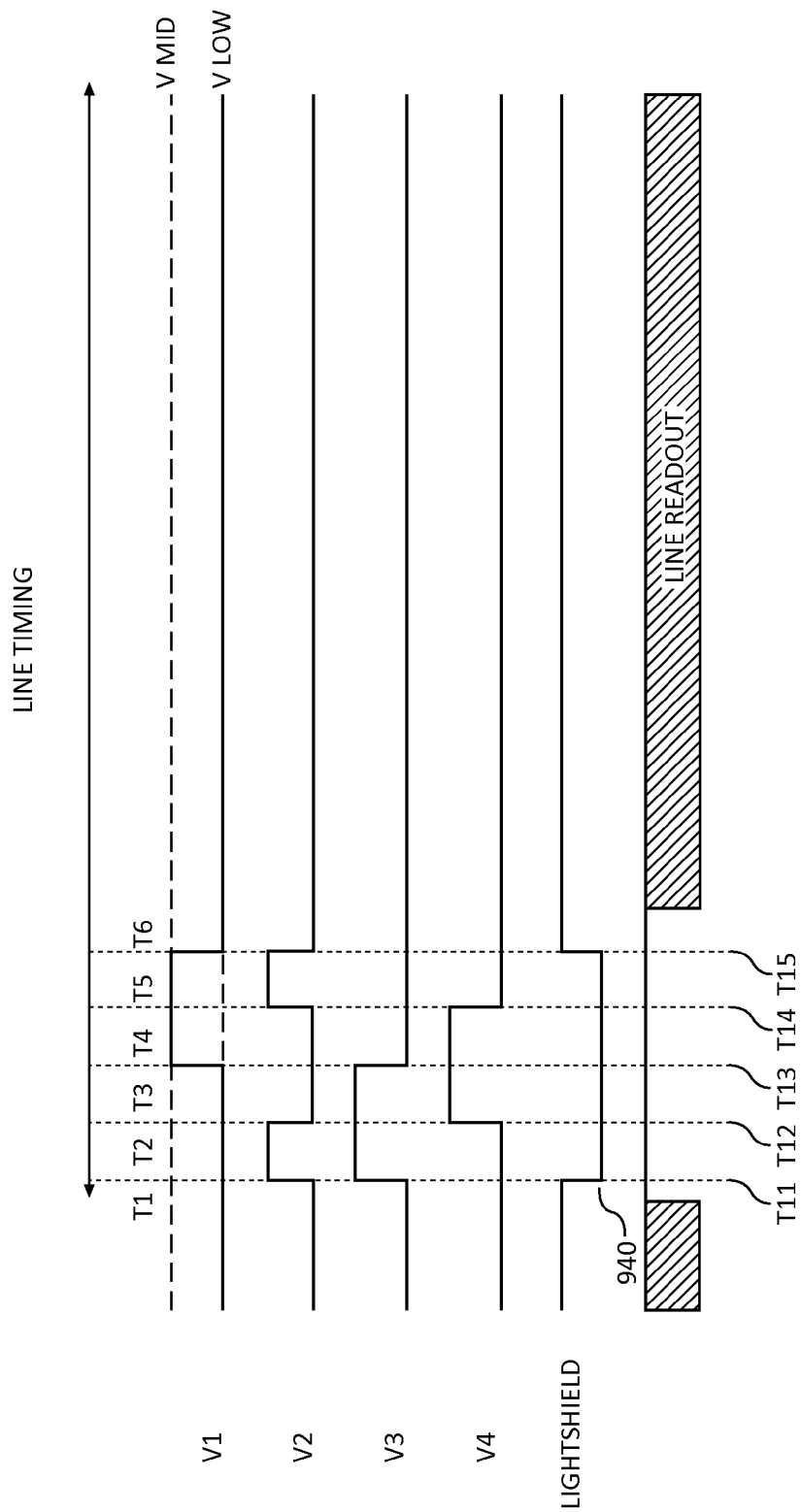
FIG. 9 is an accumulation mode timing diagram that shows compensating voltages applied to a lightshield in accordance with an embodiment.

When the gate voltage is switched positive the previously accumulated holes move to the other regions of the device, and the gate and the region of the VCCD below the gate may be referred to as "depleted." However, the flow of holes to other regions within the device is not instantaneous for those bound to the interface states 815, 820. The characteristic time for hole emission is approximately 0.7 ms at 60 C, and is illustrated in FIG. 9. Only after a hole is emitted 825, as shown in FIG. 8C, is there an undesirable increase in the dark current generation rate due to the unterminated bond 815.

Figure 8D:
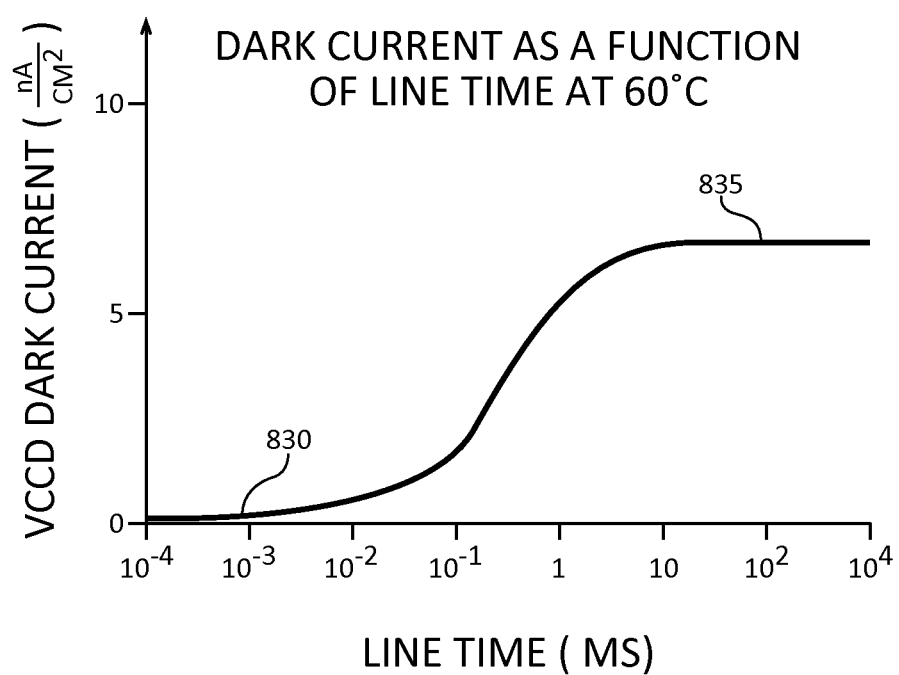
FIG. 8D is a graph illustrating VCCD dark current as a function of line time.

FIG. 8D is a graph illustrating VCCD dark current as a function of line time. If the line time is short, as in region 830 of FIG. 8D, then the holes do not have enough time to emit and the VCCD dark current is low. If the line time is long, as in region 835 of FIG. 8D, then the VCCD dark current approaches the full depletion mode dark current. The characteristic emission time, $\tau$, is given by equation 2 below:

$$\tau = \frac{1}{n_i v_{th} \sigma} \quad (2)$$

In equation 2, $n_i$ is the intrinsic carrier concentration, $v_{th}$ is the carrier thermal velocity, and $\sigma$ is the effective capture cross section. For silicon, $n_i=3.1\times10^{16}T^{3/2}e^{(-0.603/kT)}$ cm$^{-3}$, $v_{th}=1.0\times10^7(T/300)^{1/2}$ cm/s, and $\sigma=1\times10^{-15}$ cm$^2$ for an interface trap. This gives $\tau=0.7$ milliseconds at T=60 degrees Celsius.

Figure 10:
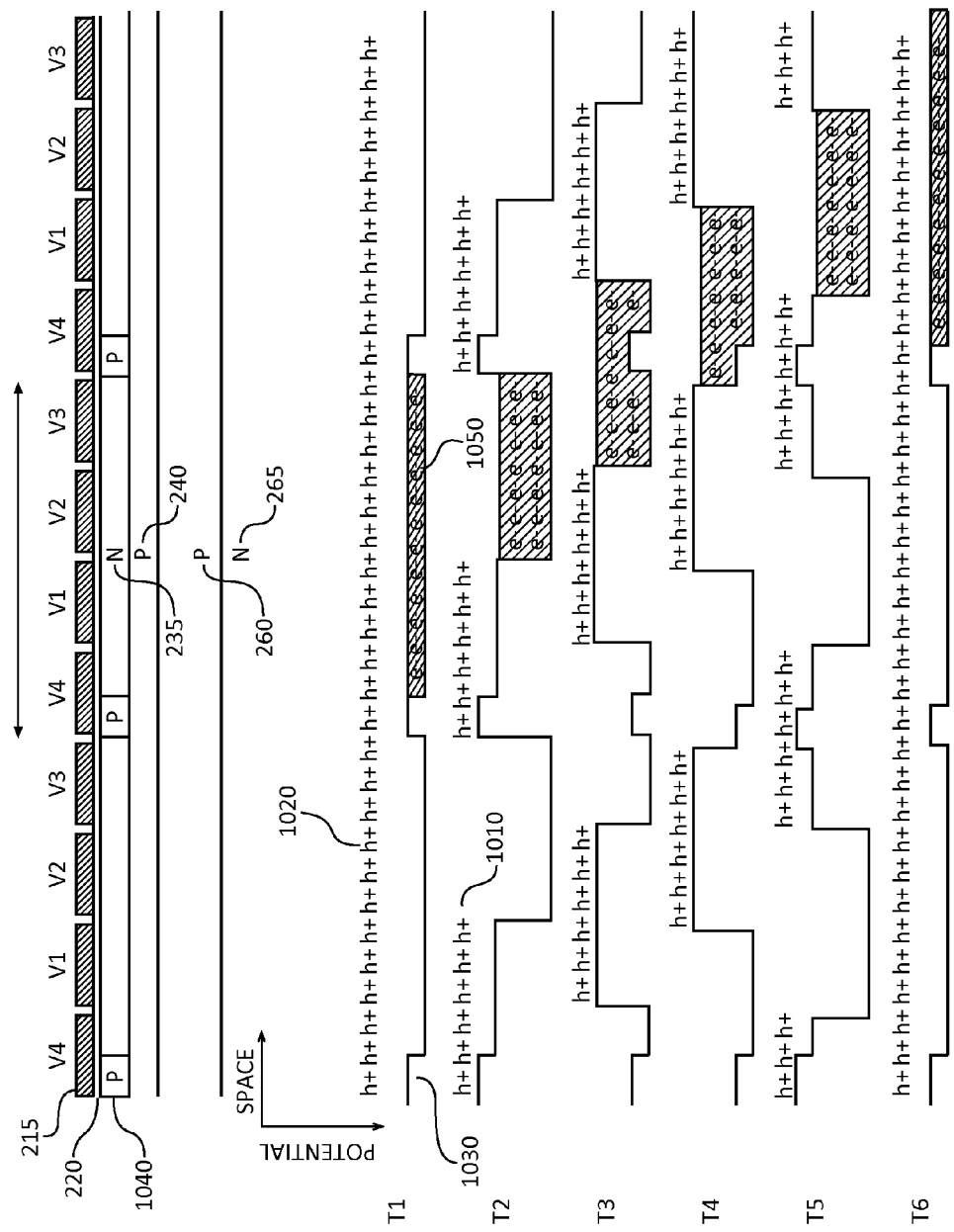
FIG. 10 illustrates a cross-sectional side view through line B-B' in FIG. 3A of a 4-phase interline CCD including barrier implants, with a step-by-step illustration of the flow of photo-generated electrons for line timing in accordance with an embodiment.

FIG. 9 illustrates the "accumulation mode" timing embodiment of the invention. The timing given in FIG. 9 is consistent with the step-by-step illustration of the flow of photo-generated electrons and holes illustrated in FIG. 10. Changing applied voltages with a clock driver to gate electrodes also controls movement of photo-generated charge up or down the VCCD channel by manipulating the channel potential 1030. Notably, FIG. 10 illustrates photo-generated charge 1050 being transferred in a VCCD 130/235. The upper portion of FIG. 10 illustrates a cross sectional side view along the B-B' line of FIG. 3A, with a barrier p-type implant 1040 that may be added to the VCCD buried channel 130/235 to isolate photo-generated charges 1050 between rows. The lower portion of FIG. 10 illustrates potential graphs in the regions of the VCCD 130/235 illustrated in the upper portion of FIG. 10 at different intervals of the line timing diagram illustrated in FIG. 9.

During line readout in intervals T1 and T6, all gates may be held negative and holes 1020 (represented as h$^+$ in FIGS. 10 and 11) are accumulated under all gates. FIG. 9 shows that gates V1-V4 may be held at negative voltage levels Vlow in intervals T1 and T6. As illustrated in FIG. 10, during interval T1, photo-generated charge 1050 (illustrated by the shaded region of e$^-$ charges) is located beneath gates V1-V4 of a given unit pixel.

At the first clock edge t11, a positive voltage may be applied to gates V2 and V3, placing the silicon regions underlying gates V2 and V3 into depletion during interval T2. Instead of clocking V1 and V4 more negative to compensate the V2 and V3 clock edges to satisfy the compensated condition defined by equation 1, lightshield 210 may be clocked negative to a voltage level 940 at edge t11. The transition of the voltage applied to lightshield 210 may typically be a transition from 0 V to −7 V. However, the voltage level 940 may be any negative voltage level, and may be greater than or less than the voltage level Vlow.

During interval T2, gates V2 and V3 are positively biased, and therefore the potential diagram of FIG. 10 corresponding to interval T2 does not show any accumulated holes such as accumulated holes 1020 underneath gates V2 and V3. In the T2 diagram of FIG. 10, accumulated holes 1010 are only shown underneath gates V1 and V4, which are still held negative during interval T2. Because FIG. 10 illustrates a cross sectional side view of the VCCD along the B-B' line of FIG. 3A, the region of the semiconductor over which the light-shield 210 is formed (specifically, the region of the semiconductor formed beneath the region of dielectric 220 which contacts lightshield 210) is not visible.

Figure 11A:
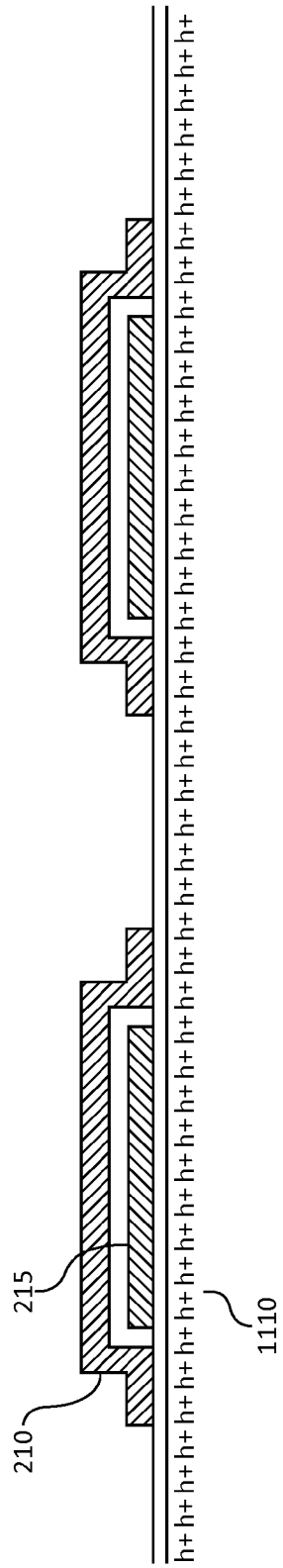
FIG. 11A illustrates a cross-sectional side view through line A-A' in FIG. 1 illustrating the accumulation of holes under negatively biased VCCD gates.
Figure 11B:
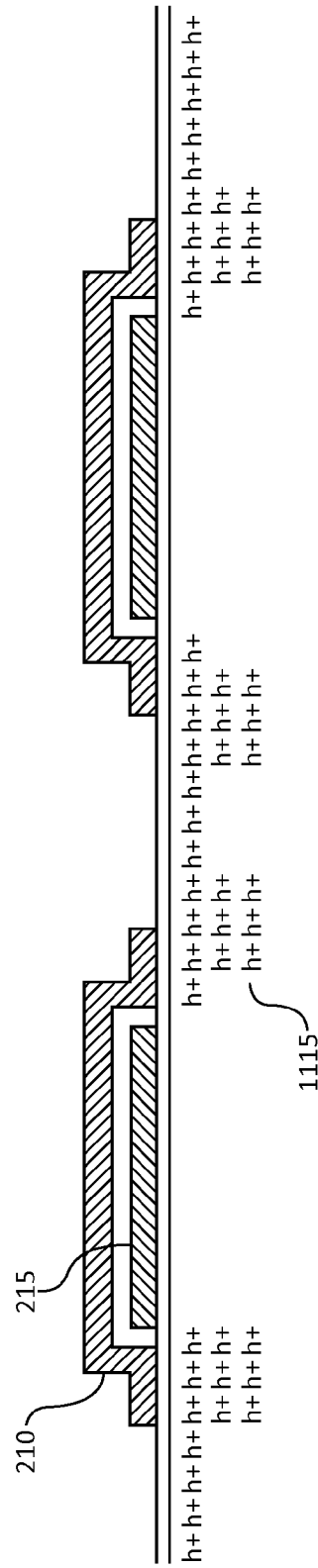
FIG. 11B illustrates a cross-sectional side view through line A-A' in FIG. 1 illustrating the accumulation of holes under negatively biased lightshields.

Turning to FIG. 11A, which is a cross-sectional side view through line A-A' in FIG. 1 that omits the doped regions in the semiconductor for simplicity, accumulated holes 1110 may correspond to the holes accumulated during intervals T1 and T6 when all the gates are held negative. FIG. 11B illustrates how holes 1115 may accumulate under lightshield 210 when lightshield 210 is negatively biased in at least interval T2, while a gate 215 is positively biased resulting in the underlying semiconductor to be depleted and thereby causing holes to be emitted from the semiconductor regions underneath the positively biased gate or gates.

Returning to FIGS. 9 and 10, at clock edge t12 and interval T3, charge is shifted to under V3 and V4. In the T3 diagram of FIG. 10, no accumulated holes are shown in the semiconductor underneath the positively biased gates V3 and V4, but accumulated holes are shown in the semiconductor underneath the gates V1 and V2 which are negatively biased during interval T3. Because lightshield 210 is also negatively biased during interval T3, holes 1115 will also accumulate underneath the lightshield 210 as shown in FIG. 11B during interval T3.

At the third clock transition t13 and interval T4, charge is shifted to under V4 and V1. In the T4 diagram of FIG. 10, no accumulated holes are shown in the semiconductor underneath the positively biased gates V4 and V1, but accumulated holes are shown in the semiconductor underneath the gates V2 and V3 which are negatively biased during interval T4. Because lightshield 210 is also negatively biased during interval T4, holes 1115 will also accumulate underneath the lightshield 210 as shown in FIG. 11B during interval T4.

At the fourth clock transition t14 and interval T5, charge is shifted to under V1 and V2. In the T5 diagram of FIG. 10, no accumulated holes are shown in the semiconductor underneath the positively biased gates V1 and V2, but accumulated holes are shown in the semiconductor underneath the gates V3 and V4 which are negatively biased during interval T4. Because lightshield 210 is also negatively biased during interval T5, holes 1115 will also accumulate underneath the lightshield 210 as shown in FIG. 11B during interval T5.

Finally, at clock transition t15 and interval T6, all the gates are again accumulated (by being biased at a low voltage Vlow such as −7V), the lightshield 210 is clocked positive, and the signal charge 1050 has advanced one row in VCCD 130/235 from a region corresponding to and adjacent to a first unit pixel to a region adjacent to a second unit pixel. The T6 diagram of FIG. 10 illustrates that holes may be accumulated in VCCD 130/235 underneath all of the gates.

The key aspect of this embodiment is the flow of holes 1010 and 1020, as illustrated in FIGS. 10 and 11. At the first clock transition t11 in interval T2, because V1 and V4 are not clocked more negative than they were in interval T1, the holes that were under V2 and V3 in interval T1 do not flow to under the V1 and V4 gates in interval T2. Instead, as illustrated in FIG. 11B the excess holes 1115 flow to the region of semiconductor under the lightshield 210. Therefore, there is only a local flow of holes within the pixel and no well bounce.

FIG. 9 illustrates the timing of this embodiment for a 4-phase device, but the basic technique applies to 3-phase and multi-phase devices, and even to true 2-phase devices and full-frame CCDS. The steps of the technique of the present invention may generally include accumulating holes under all gates during line readout by negatively biasing all gates, as in interval T1 of FIGS. 9 and 10. Then, lightshield 210 may be negatively biased (or have a negative voltage applied to it) during the first positive clock transition of the gates (or, in response to the first positive clock transition), to compensate the positive clock transition of the gates and satisfy the condition of equation 1. Intermediate gate clock transitions, such as those that occur after the first positive transition of the gates may also compensated, by maintaining a negative bias voltage on lightshield 210 as long as there are positive voltages applied to the gates. After a final negative clock transition of the gates, such as in interval T6, when all the gates are held negative, the lightshield may be clocked positive.

Notably, in the clocking method of FIG. 9 only requires that two voltages be applied to the gates: a first voltage at a first magnitude (such as Vmid) and a second voltage at a second magnitude that is greater than the first magnitude (such as Vlow).

Figure 12:
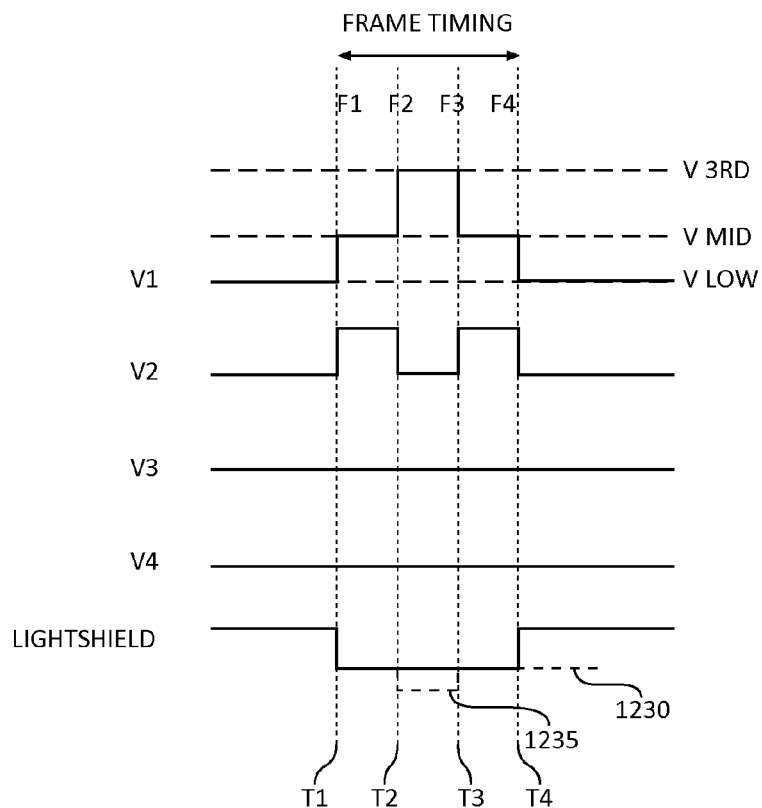
FIG. 12 is a third frame timing diagram that shows compensating voltages applied to a lightshield in accordance with an embodiment.

FIG. 12 illustrates a third frame timing diagram in accordance with an embodiment. The transfer of photo-generated electrons from the photodiode 230 to the VCCD 235 occurs during the frame timing. Initially, in interval F1, all gates may be held negative and holes 1020 are accumulated under all gates. At the first clock transition edge t1 of FIG. 12, positive voltages may be applied to gates V1 and V2; to compensate the positive voltages applied to gates V1 and V2, the lightshield 210 may be clocked negative to a level 1230 at edge t1 of FIG. 12. In interval F2, a voltage Vmid may be applied to gate V1. As in the above illustration and description of FIGS. 9 and 10, negatively biasing the lightshield 210 at edge t1 of FIG. 12 for at least interval F2 allows holes that are displaced or set into motion by the assertion of positive voltages on gates V1 and V2 to be accumulated under lightshield 210 in a manner similar to holes 1115 of FIG. 11B, thereby eliminating well bounce.

At the second clock transition edge t2 of FIG. 12, a third level voltage V3rd that is greater than Vmid may be applied to V1 to transfer charge from the photodiode 230 to the VCCD register 235; to compensate the assertion of V3rd at gate V1 during interval F3, V2 may be clocked negative in interval F3. At edge t2 of FIG. 12, lightshield 210 may optionally be clocked further negative to a voltage level 1235 to provide additional compensation in interval F3 while third level voltage V3rd is applied to V1. Alternatively, a voltage level 1230 may be maintained on lightshield 210 during interval F3. At the third clock transition t3 of FIG. 12, V1 and V2 return to Vmid for an interval F4; during interval F4, lightshield 210 may continue to be negatively biased to compensate for the positive biases applied to gates V1 and V2. Finally, at clock transition t4 of FIG. 12, all the gates are again accumulated (at −7V, for example) in an interval F5, and a positive bias voltage may be applied to lightshield 210 at edge t4 of FIG. 12 to compensate for the negative bias voltages on the gates during interval F5.

As an example, the magnitude of the difference between V3rd and Vmid may be 12V, the magnitude of the difference between Vmid and Vlow may be 7V, the magnitude of the difference between the voltage applied to lightshield 210 before t1 and the voltage level 1230 may be 7V, and the magnitude of the difference between voltage level 1230 and voltage level 1235 may be 4V.

Figure 13:
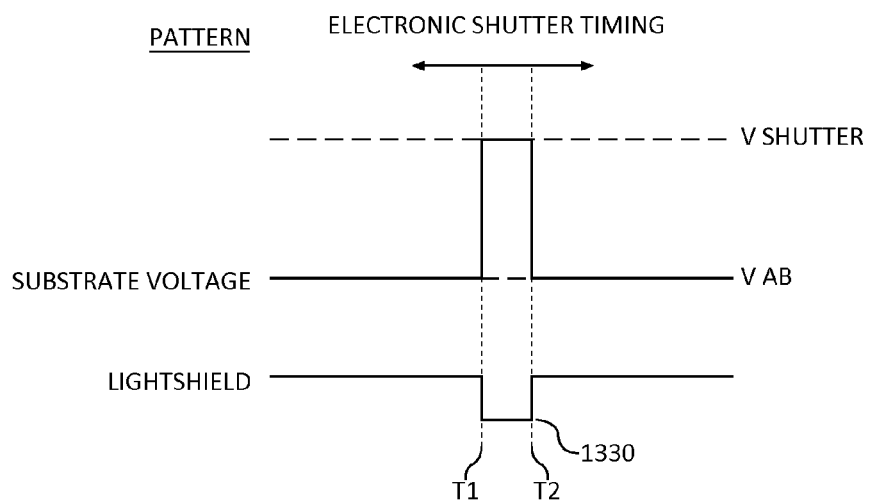
FIG. 13 is an electronic shutter timing diagram in accordance with an embodiment.

FIG. 13 is an electronic shutter timing diagram in accordance with an embodiment. Consider the interline CCD illustrated in FIG. 2. The substrate 265 may be electrically connected to a contact on which a controlled voltage can be applied. As the voltage applied to the contact connected to substrate 265 (sometimes referred to as "the substrate voltage") more positive, the capacity of the photodiode 230 decreases because the vertical overflow potential barrier from the photodiode to the substrate decreases. If the substrate voltage is sufficiently high then the photodiode capacity is zero. Therefore, pulsing the substrate with a large voltage provides an electronic shutter action for globally clearing the photodiode array. Clearing photodiodes may correspond to emptying the charges accumulated in the photodiodes, effectively resetting the photodiodes; clearing or resetting the photodiodes is the standard method for setting the start of integration time (or, the period during which photodiodes accumulate photo-generated charge) for an image capture.

However, even though the substrate to well capacitance is less than the gate to well capacitance, well bounce is still problematic when resetting photodiodes by applying a large voltage to the substrate 265. The electronic shutter timing in FIG. 11 reduces well bounce, and hence reduces the shutter voltage (Vshutter) applied to the substrate that is required to completely empty the photodiode. The reduction in well bounce and the reduction of the magnitude of Vshutter is accomplished by applying a compensating voltage at a level 1330 to the lightshield 210 in the interval between edges t1 and t2 during which Vshutter is applied to substrate. This method also applies to devices with lateral overflow drains. In image sensors with lateral overflow drains, a compensating voltage at a level 1330 may be applied to lightshield 210 during a first interval, to compensate a positive voltage that is applied to the lateral overflow gate during the first interval to reset or clear the photodiode. As an example, the Vshutter voltage may be 19 V and the lightshield pulse level 1330 may be −7 V.

Figure 14:
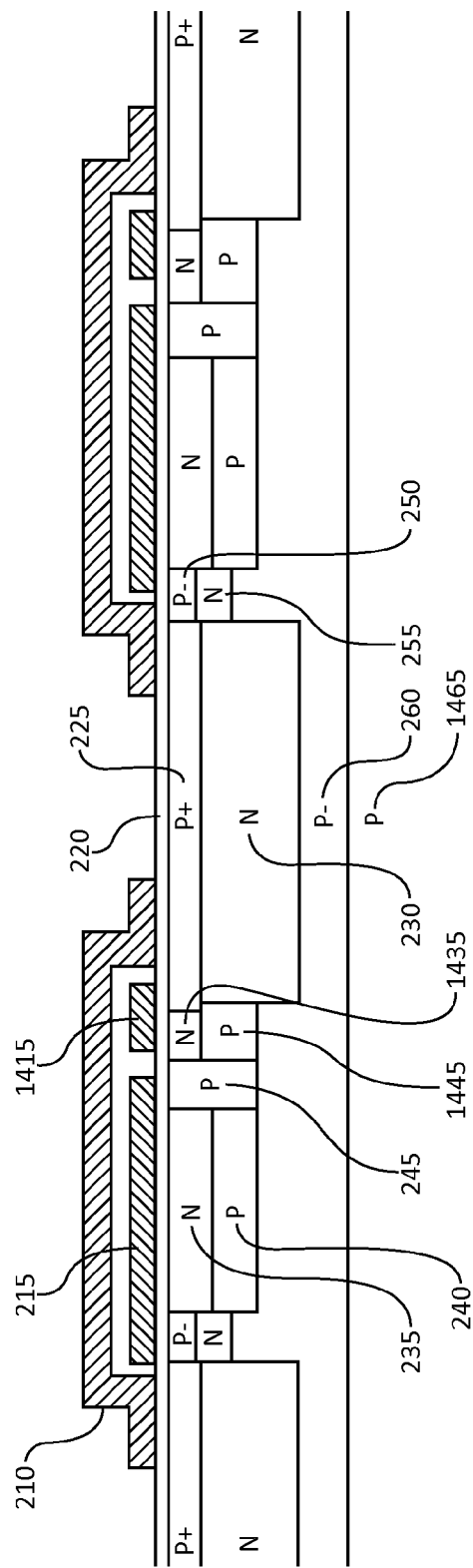
FIG. 14 illustrates a cross-sectional side view through line A-A' in FIG. 3A of a 4-phase interline CCD including lateral overflow drains in accordance with an embodiment.

FIG. 14 illustrates a cross-sectional side view through line A-A' in FIG. 3A that illustrates a lateral overflow drain structure. An interline CCD that utilizes lateral overflow drains may be formed in a p-type substrate 1465. The Vshutter voltage described above in connection with FIG. 13 may be applied to a lateral overflow drain electrode 1415 that is formed over n-type region 1435 associated with the lateral overflow drain structure. P-type region 1445 may be formed below n-type region 1435 relative to the interface between the semiconductor and dielectric layer 220. When the Vshutter voltage is applied to lateral overflow drain electrode 1415, photogenerated charge from photodiode 230 may be transferred into the lateral drain structure region formed by regions 1435 and 1445. Specifically, photogenerated charge may be transferred to the n-type region 1435 when the Vshutter voltage is applied to electrode 1415 (i.e., in the interval between t1 and t2 of FIG. 13). While the Vshutter voltage is applied to electrode 1415, the compensating voltage having a level 1330 may be applied to the lightshield 210. As an example, the Vshutter voltage may be 19V and the lightshield pulse level 1330 may be −7V.

Various embodiments have been described illustrating methods of clocking an image sensor. An image sensor may include multiple photodiodes. The photodiodes may be arranged in rows and columns. A vertical charge-coupled device (VCCD) may be associated with each column of photodiodes in the image sensor. The VCCD may simply be referred to as a CCD. Multiple gate contacts may be formed over the VCCD. Each photodiode may be associated with a subset of the multiple gate contacts formed over the VCCD. The subset of the multiple gate contacts formed over the VCCD associated with a given photodiode may be adjacent to the given photodiode.

To transfer photo-generated charge from a photodiode, one or more gate contacts associated with the photodiode may be biased with voltages. The bias voltages applied to the one or more gate contacts may be positive voltages, negative voltages, or ground voltages. To transfer the photo-generated charge accumulated in the photodiode, a first bias voltage may be applied to a first gate of the one or more gate contacts associated with the photodiode. Subsequent to applying the first bias voltage to the first gate, a second bias voltage having a magnitude that is greater than the magnitude of the first bias voltage may be applied to the first gate. The second bias voltage may be referred to as the "third-level voltage."

While photo-generated charge is transferred from the photodiode to the CCD, positive bias voltages may be applied to one or more of the multiple gates associated with the photodiode, causing the movement of holes in the semiconductor in which the photodiode and CCD are formed. This movement of holes may be most pronounced in regions of the semiconductor where holes are the majority charge carriers, such as in p-type doped regions of the semiconductor. In large image sensors, the movement of holes can cause a voltage drop in the well potential of photodiodes near the center of the image sensor; this may make the complete transfer of charge generated in photodiodes (or, readout of the photodiodes) near the center of the image sensor very time consuming, if not impossible.

During the transfer of photo-generated charge, either from a photodiode to a CCD or from a first region of the CCD to a second region of the CCD, a lightshield may be biased with a compensating voltage. Biasing the lightshield with a compensating voltage results in holes to accumulate under the lightshield. The compensating voltage may be a negative voltage. The lightshield may be at least partially formed over a region of the photodiode. The compensating biasing voltage applied to the lightshield may be adjusted based on the degree of compensation that is desired. The degree of compensation that is desired may depend on the magnitude of the voltages applied to the gate contacts formed above the VCCD, the number of gate contacts on which the biasing voltages are applied, and the polarity of the voltages applied to the gate contacts (i.e., whether the voltage is a positive voltage or a negative voltage).

Applying a compensating voltage to the lightshield while transferring charges from one region of the CCD to another region of the CCD may enable the gates formed over the CCD to be biased with only one of two voltage levels: a high voltage level and a low voltage level. Before charges are transferred from one region of the CCD to another region of the CCD, an accumulation bias voltage may be asserted at all the gate contacts formed above the CCD. The accumulation bias voltage may again be asserted at all the gate contacts formed above the CCD when after the charges have been transferred from one region of the CCD to another region of the CCD. A compensating bias voltage may be asserted at the lightshield while charges being transferred from one region of the CCD to another region of the CCD. The compensating bias voltage may be deasserted at the lightshield before and after the charge has been transferred from one region of the CCD to another region of the CCD.

The lightshield may also be biased during an electronic shutter operation of the image sensor, in which a positive shutter voltage is applied to a conductive contact on the semiconductor substrate to drain charges from the photodiodes of the image sensor into the substrate. While the positive shutter voltage is applied to the substrate, the lightshield may be biased with a compensating negative voltage. Negatively biasing the lightshield with the compensating negative voltage may result in a decrease in the magnitude of the positive shutter voltage that is required to completely clear or drain the charges in the photodiodes of the image sensor. During the electronic shutter operations, charges may be drained into vertical overflow drains that are formed at a first depth in the substrate that is deeper than a second depth in the substrate at which the photodiodes are formed (relative to a surface of the substrate), or charges may be drained into lateral overflow drains that are adjacent to the photodiodes.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of clocking an image sensor that includes a photodiode that is adjacent to a vertical charge-coupled device (VCCD), wherein the photodiode has an associated light-shielding structure that is formed over at least a part of the photodiode and the VCCD, the method comprising:
    transferring charge in the photodiode to a first region of the VCCD, wherein a first plurality of gate contacts are formed over the first region of the VCCD; and
    while transferring the charge from the photodiode to the first region of the VCCD, applying a first compensating bias voltage to the light-shielding structure to compensate for net charge imbalance caused by transferring the charge;
    transferring the charge from the first region of the VCCD to a second region of the VCCD, wherein a second plurality of gate contacts associated with another photodiode in the image sensor are formed over the second region of the VCCD;
    while transferring the charge from the first region of the VCCD to the second region of the VCCD, applying a second compensating bias voltage to both the light-shielding structure and an additional light-shielding structure formed over the second region of the VCCD.

2. The method defined in claim 1, wherein a pinning region having a first doping type is formed over the photodiode, wherein the photodiode has a second doping type that is different from the first doping type, and wherein applying the first compensating bias voltage comprises:
    accumulating majority charge carriers associated with the first doping type underneath the light-shielding structure to mitigate well bounce.

3. The method defined in claim 1, wherein transferring the charge in the photodiode to the VCCD comprises:
    applying a first bias voltage to a gate electrode that is formed over the VCCD and that is adjacent to the photodiode; and
    applying a second bias voltage to the gate electrode after applying the first bias voltage to the gate electrode, wherein the second bias voltage is greater than the first bias voltage.

4. The method defined in claim 3, wherein applying the first compensating bias voltage to the light-shielding structure comprises:
    applying a negative bias voltage to the light-shielding structure associated with the given pixel while the second bias voltage is applied to the gate electrode.

5. The method defined in claim 3, wherein the gate electrode comprises a first gate electrode, and wherein transferring charge in the photodiode to the VCCD further comprises:
    while the second bias voltage is applied to the first gate electrode, applying a third bias voltage that is greater than the first bias voltage to a second gate electrode that is formed over the VCCD and that is adjacent to the first gate electrode and the photodiode.

6. The method defined in claim 3, wherein the gate electrode comprises a first gate electrode, and wherein transferring charge in the given photodiode to the VCCD further comprises:
    while the second bias voltage is applied to the first gate electrode, applying a third bias voltage that is less than the first bias voltage to a second gate electrode that is formed over the VCCD and that is adjacent to the first gate electrode and the photodiode.

7. The method defined in claim 1, wherein the photodiode is one of a plurality of photodiodes formed in a substrate, and wherein each of the plurality of photodiodes is associated with a respective light-shielding structure, the method further comprising:
    clearing charges in the plurality of photodiodes by applying a shutter voltage to the substrate; and
    applying a negative bias voltage to the respective light-shielding structures associated with the plurality of photodiodes while the shutter voltage is applied to the substrate.

8. A method of clocking an image sensor that includes a photodiode formed in a substrate, and wherein the photodiode is associated with a light-shielding structure that is formed over at least a part of the photodiode, the method comprising:
    draining charge in the photodiode by applying a positive bias voltage to the substrate;
    while applying the positive bias voltage to the substrate, applying a first negative bias voltage to the light-shielding structure;
    in response to draining the charge in the photodiode, accumulating charges in the photodiode;
    transferring the accumulated charges in the photodiode to a first region of a vertical charge-coupled device (VCCD) that is adjacent to the photodiode, wherein a first set of gate contacts are formed over the first region of the VCCD; and
    after transferring the accumulated charges to the first region of the VCCD, transferring the accumulated charges to a second region of the VCCD while applying a second negative bias voltage to both the light-shielding structure and an additional light-shielding structure formed over the second region of the VCCD, wherein a second set of gate contacts associated with another photodiode in the image sensor are formed over the second region of the VCCD.

9. The method defined in claim 8, wherein the photodiode is one of a plurality of photodiodes arranged in rows and columns, and wherein draining the charge in the photodiodes comprises:
    performing a global shutter reset by clearing the charges in the rows and columns of photodiodes.

10. The method defined in claim 8, wherein the photodiode is formed at a first depth from a surface of the substrate, wherein the photodiode has an associated vertical overflow drain that is formed in the substrate and that is formed at a second depth from the surface of the substrate that is greater than the first depth, and wherein draining the charge in the photodiode comprises:

draining the charge in the photodiode into the vertical overflow drain.

11. The method defined in claim 8, wherein the photodiode has an associated lateral overflow drain that is formed in the substrate and that is adjacent to the photodiode, and wherein draining the charge in the photodiode comprises:

draining the charge in the photodiode into the lateral overflow drain.

12. A method for clocking an image sensor that includes first and second photodiodes that are adjacent to a vertical charge-coupled device (VCCD), wherein the first photodiode is associated with a first light-shielding structure that is formed over at least a part of the first photodiode and the VCCD, and wherein the second photodiode is associated with a second light-shielding structure that is formed over at least a part of the second photodiode and the VCCD, the method comprising:

transferring a first charge in the first photodiode to the VCCD and transferring a second charge in the second photodiode to the VCCD, wherein the first photodiode is associated with a first plurality of gate contacts formed over the VCCD, and wherein the second photodiode is associated with a second plurality of gate contacts formed over the VCCD;

transferring the first charge from a first region in the VCCD under the first plurality of gate contacts to a second region in the VCCD under the second plurality of gate contacts; and while transferring the first charge, applying a compensating voltage to the light-shielding structures associated with the first and second photodiodes to compensate for net charge imbalance caused by transferring the first charge.

13. The method defined in claim 12, wherein a pinning layer is formed over the first and second photodiodes, wherein the pinning layer is a p-type semiconductor, and wherein applying the compensating voltage comprises:

applying a negative bias voltage to the light shielding structures associated with the first and second photodiodes.

14. The method defined in claim 12, wherein a pinning layer is formed over the first and second photodiodes, wherein the pinning layer is an n-type semiconductor, and wherein applying the compensating voltage comprises:

applying a positive bias voltage to the light shielding structures associated with the first and second photodiodes.

15. The method defined in claim 12, further comprising:

before transferring the first charge, applying negative bias voltages to each of the gate contacts in the first and second pluralities of gate contacts.

16. The method defined in claim 12, further comprising:

after transferring the first charge, applying negative bias voltages to each of the gate contacts in the first and second pluralities of gate.

17. The method defined in claim 12, wherein transferring the first charge comprises:

applying voltages to the gate contacts of the first and second pluralities of gate contacts, wherein the voltages are only of first and second voltage levels.

18. The method defined in claim 17, wherein transferring the first charge further comprises:

applying a first bias voltage having the first voltage level to all of the gate contacts of the first and second pluralities of gate; and applying a second bias voltage having the second voltage level to selected gate contacts in the first and second pluralities of gate contacts.

19. The method defined in claim 18, wherein the second voltage level is a positive voltage, and wherein applying the compensating voltage comprises:

applying a negative voltage to the light-shielding structures associated with the first and second photodiodes when the second bias voltage is applied to the selected gate contacts in the first and second pluralities of gate contacts; and deasserting the applied negative voltage on the light-shielding structures associated with the first and second photodiodes when the first bias voltage is applied to all of the gate contacts of the first and second pluralities of gate contacts.

20. The method defined in claim 18, wherein the second voltage level is a negative voltage, and wherein applying the compensating voltage comprises:

applying a positive voltage to the light-shielding structures associated with the first and second photodiodes when the second bias voltage is applied to the selected gate contacts of the first and second pluralities of gate contacts; and deasserting the applied positive voltage on the light-shielding structures associated with the first and second photodiodes when the first bias voltage is applied to all of the gate contacts of the first and second pluralities of gate.

21. The method defined in claim 12, wherein transferring the first and second charges in the plurality of photodiodes to the VCCD comprises:

applying a first voltage having a first polarity to at least a first gate contact in the first plurality of gate contacts; and applying a second voltage having a second polarity that is the opposite of the first polarity to the light-shielding structures that are associated with the first and second photodiodes while the first voltage is applied.

22. The method defined in claim 21, wherein the first voltage has a first magnitude, wherein the second voltage has a second magnitude that is less than the first magnitude, and wherein transferring the first and second charges in the plurality of photodiodes to the VCCD further comprises:

applying a third voltage having the first polarity to at least the first gate contact in the first plurality of gate contacts, wherein the third voltage has a third magnitude that is greater than the first magnitude; and applying a fourth voltage having the second polarity to the light-shielding structures that are associated with the first and second photodiodes while the third voltage is applied, wherein the fourth voltage has a fourth magnitude that is greater than the second magnitude.

* * * * *